US010891836B2

(12) United States Patent
Eun

(10) Patent No.: US 10,891,836 B2
(45) Date of Patent: Jan. 12, 2021

(54) INPUT/OUTPUT PORT MOUNTING UNIT INTEGRATED TYPE DISPLAY FRAME FOR POS EQUIPMENT

(71) Applicant: POSBANK CO., LTD, Seoul (KR)

(72) Inventor: Dong Uk Eun, Gwangmyeong (KR)

(73) Assignee: POSBANK CO., LTD, Seoul (KR)

( * ) Notice: Subject to any disclaimer, the term of this patent is extended or adjusted under 35 U.S.C. 154(b) by 0 days.

(21) Appl. No.: 16/084,042

(22) PCT Filed: Sep. 27, 2017

(86) PCT No.: PCT/KR2017/010763
§ 371 (c)(1),
(2) Date: Sep. 11, 2018

(87) PCT Pub. No.: WO2018/066883
PCT Pub. Date: Apr. 12, 2018

(65) Prior Publication Data
US 2020/0294371 A1    Sep. 17, 2020

(30) Foreign Application Priority Data
Oct. 7, 2016   (KR) .................. 10-2016-0129505

(51) Int. Cl.
*G07G 1/01*    (2006.01)
*F16M 11/04*   (2006.01)
(Continued)

(52) U.S. Cl.
CPC ............. *G07G 1/01* (2013.01); *F16M 11/041* (2013.01); *G06F 1/1601* (2013.01); *G06F 1/181* (2013.01);
(Continued)

(58) Field of Classification Search
CPC .......... G07G 1/01; G07G 1/12; F16M 11/041; G06F 1/1601; G06F 1/181; G06F 1/183; G06F 1/20; H05K 7/20127
(Continued)

(56) References Cited
U.S. PATENT DOCUMENTS

| 5,978,225 | A | * | 11/1999 | Kamphuis | ................. | G06F 1/20 |
| | | | | | | 165/80.2 |
| 6,053,410 | A | * | 4/2000 | Wike, Jr. | .................. | G06F 1/16 |
| | | | | | | 235/462.43 |
| 6,053,411 | A | * | 4/2000 | Nugent, Jr. | .......... | G07G 1/0018 |
| | | | | | | 235/462.43 |
| 6,053,412 | A | * | 4/2000 | Wike, Jr. | .................. | G06F 1/16 |
| | | | | | | 235/375 |

(Continued)

FOREIGN PATENT DOCUMENTS

| CN | 201590752 U | 9/2010 |
| CN | 204156249 U | 2/2015 |

(Continued)

*Primary Examiner* — Daniel A Hess
(74) *Attorney, Agent, or Firm* — Patentfile, LLC; Bradley C. Fach; Steven R. Kick

(57) ABSTRACT

The present invention relates to an input/output port mounting unit integrated type display frame for POS equipment, the input/output port mounting unit integrated type display frame (300) for POS equipment comprising: a display panel mounting unit (310), in which a display panel (50) is loaded, formed at a front surface thereof; an input/output port mounting unit (320) formed at a rear surface thereof and having an input/output port mounting hole (322), in which an input/output port (31) provided at a main substrate (30) is inserted and coupled, the input/output port mounting unit having a part cut from an input/output port mounting unit perforation (321) and being formed to be bent towards the rear direction so as to be protruded therefrom; and a lower main ventilation hole (330) formed at a lower side of the rear surface thereof.

5 Claims, 5 Drawing Sheets

(51) Int. Cl.
*G06F 1/16* (2006.01)
*G06F 1/18* (2006.01)
*G06F 1/20* (2006.01)
*G07G 1/12* (2006.01)
*H05K 7/20* (2006.01)

(52) U.S. Cl.
CPC .............. *G06F 1/183* (2013.01); *G06F 1/20* (2013.01); *G07G 1/12* (2013.01); *H05K 7/20127* (2013.01)

(58) Field of Classification Search
USPC .......................................................... 235/23
See application file for complete search history.

(56) References Cited

U.S. PATENT DOCUMENTS

| | | | |
|---|---|---|---|
| 9,033,228 B2* | 5/2015 | Govindarajan | G07G 1/0018 235/383 |
| 10,521,621 B2* | 12/2019 | Eun | G06F 1/16 |
| 2002/0080297 A1 | 6/2002 | Sung | |
| 2004/0036819 A1 | 2/2004 | Ryu et al. | |
| 2009/0009477 A1 | 1/2009 | Yukawa et al. | |

FOREIGN PATENT DOCUMENTS

| | | |
|---|---|---|
| CN | 204303098 U | 4/2015 |
| CN | 205353850 U | 6/2016 |
| JP | 2016091251 A | 5/2016 |
| KR | 2020090008549 | 8/2009 |
| KR | 2020140001631 | 3/2014 |
| TW | 201018370 A | 5/2010 |
| TW | 201131335 A | 9/2011 |

* cited by examiner

INPUT/OUTPUT PORT MOUNTING UNIT INTEGRATED TYPE DISPLAY FRAME FOR POS EQUIPMENT

This Application is a 35 U.S.C. 371 National Stage Entry of International Application No. PCT/KR2017/010763 filed on Sep. 27, 2017, which claims the benefit of Republic of Korea Patent Application No. 10-2016-0129505, filed on Oct. 7, 2016, the entire disclosures of which are incorporated by reference herein.

TECHNICAL FIELD

The present invention relates to an input/output port mounting unit integrated type display frame for POS equipment, and more particularly, to an input/output port mounting unit integrated type display frame 300 for POS equipment, which includes: a display panel mounting unit 310, in which a display panel 50 is loaded, formed at a front surface thereof; an input/output port mounting unit 320 formed at a rear surface thereof and having an input/output port mounting hole 322, in which an input/output port 31 provided at a main substrate 30 is inserted and coupled, the input/output port mounting unit having a part cut from an input/output port mounting unit perforation 321 and being formed to be bent towards the rear direction so as to be protruded therefrom; and a lower main ventilation hole 330 formed at a lower side of the rear surface thereof.

BACKGROUND ART

A point of sale (POS) system, which represents a point of sale management system, installs a POS terminal at a store to manage overall distribution economy such as market research, stocktaking, point of sale management as well as business transactions of sales.

That is, the POS system automatically collects and records sales management data (which will be used for the sales management and stocktaking of products), which is accompanied with product sales, by providing a POS terminal functioning as an electronic cash register and a computer at a counter for selling products of department stores or supermarkets.

While a typical cash register has a main role of rapidly and exactly calculating sales amount of a customer at a site, the current POS system collects and processes information regarding the purchase and sales of products and, on the basis of this, rapidly checks and manages all sorts of product information and accounting information.

The POS terminal has the same function as the typical cash register, a function of temporarily recording data, and a function of transmitting point of sale data to a high-ranked device while being connected to the same. A product code is entered through a scanner or key input and then transmitted to the high-ranked device.

The above-described POS terminal is generally configured such that a main substrate and a display panel for displaying an operation screen are separately mounted to a case such as a main body as disclosed in the "POS terminal device" of the below patent document 1 (Korean Patent Publication No. 10-2016-0052869).

However, the above typical invention has a limitation in manufacturing efficiency and manufacturing costs because a frame for fixing the display panel and a frame for fixing the main substrate are required to be separately manufactured, and furthermore, a process of coupling the display panel to the main substrate is required in an assembly process.

Also, since the terminal is continuously operated during business hours because of operational characteristics of the POS terminal, in this case, a structure for effectively discharging heat generated from the display panel and the main substrate is required.

DISCLOSURE OF THE INVENTION

Technical Problem

The present invention provides an input/output port mounting unit integrated type display frame for POS equipment, which is integrally formed with an input/output port mounting unit for POS equipment, which necessarily sustains a mechanical load, by perforating and bending one frame, to have an extremely efficient single structure in which a display panel, a main substrate, and an input/output port of the main substrate are mounted to each other in a mechanically firm manner, and thus manufacturing costs and efficiency of a manufacturing process are enhanced.

The present invention also provides an input/output port mounting unit integrated type display frame for POS equipment, which efficiently circulates an air current caused by heat generated from the display panel and the main substrate to efficiently discharge the heat even during a long time operation.

Technical Solution

An embodiment of the present invention provides an input/output port mounting unit integrated type display frame 300 for POS equipment, including: a display panel mounting unit 310, in which a display panel 50 is loaded, formed at a front surface thereof; an input/output port mounting unit 320 formed at a rear surface thereof and having an input/output port mounting hole 322, in which an input/output port 31 provided at a main substrate 30 is inserted and coupled, the input/output port mounting unit having a part cut from an input/output port mounting unit perforation 321 and being formed to be bent towards a rear direction so as to be protruded therefrom; and a lower main ventilation hole 330 formed at a lower side of the rear surface thereof.

In an embodiment, the input/output port mounting unit integrated type display frame 300 for POS equipment may further include a recessed kernel 350 that is recessed inward and formed between the input/output port mounting unit perforation 321 and the lower main ventilation hole 330.

In an embodiment, the input/output port mounting unit integrated type display frame 300 for POS equipment may further include a main substrate mounting unit 360 to which the main substrate 30 is mounted and fixed.

In an embodiment, the input/output port mounting unit integrated type display frame 300 for POS equipment may further include: an upper first ventilation hole 340 formed at an upper side of the input/output port mounting unit perforation 321; an upper second ventilation hole 341 formed at the upper side of the input/output port mounting unit perforation 321; and a plurality of lower auxiliary ventilation holes 331 formed at a lower side of the lower main ventilation hole 330.

In an embodiment, the POS equipment 1 may include a cover 20 that is coupled to an upper side of a rear surface case 10 in an attachable/detachable manner, and exposes the input/output port mounting unit 320 when detached, and the input/output port mounting unit 320 may be further formed with a rear surface case coupling part 323, which is formed by consecutively bending an end of the input/output port mounting unit 320 so as to be fixed to the rear surface case 10.

Advantageous Effects

The present invention may provide the input/output port mounting unit integrated type display frame for POS equipment, which is integrally formed with the input/output port mounting unit for POS equipment, which necessarily sustains a mechanical load, by perforating and bending one frame, to have the extremely efficient single structure in which the display panel, the main substrate, and the input/output port of the main substrate are mounted to each other in a mechanically firm manner, and also the manufacturing costs and the efficiency of the manufacturing process are enhanced.

The present invention may also provide the input/output port mounting unit integrated type display frame for POS equipment, which efficiently circulates an air current caused by heat generated from the display panel and the main substrate to efficiently discharge the heat even during a long time operation.

MODE FOR CARRYING OUT THE INVENTION

Figure 1:
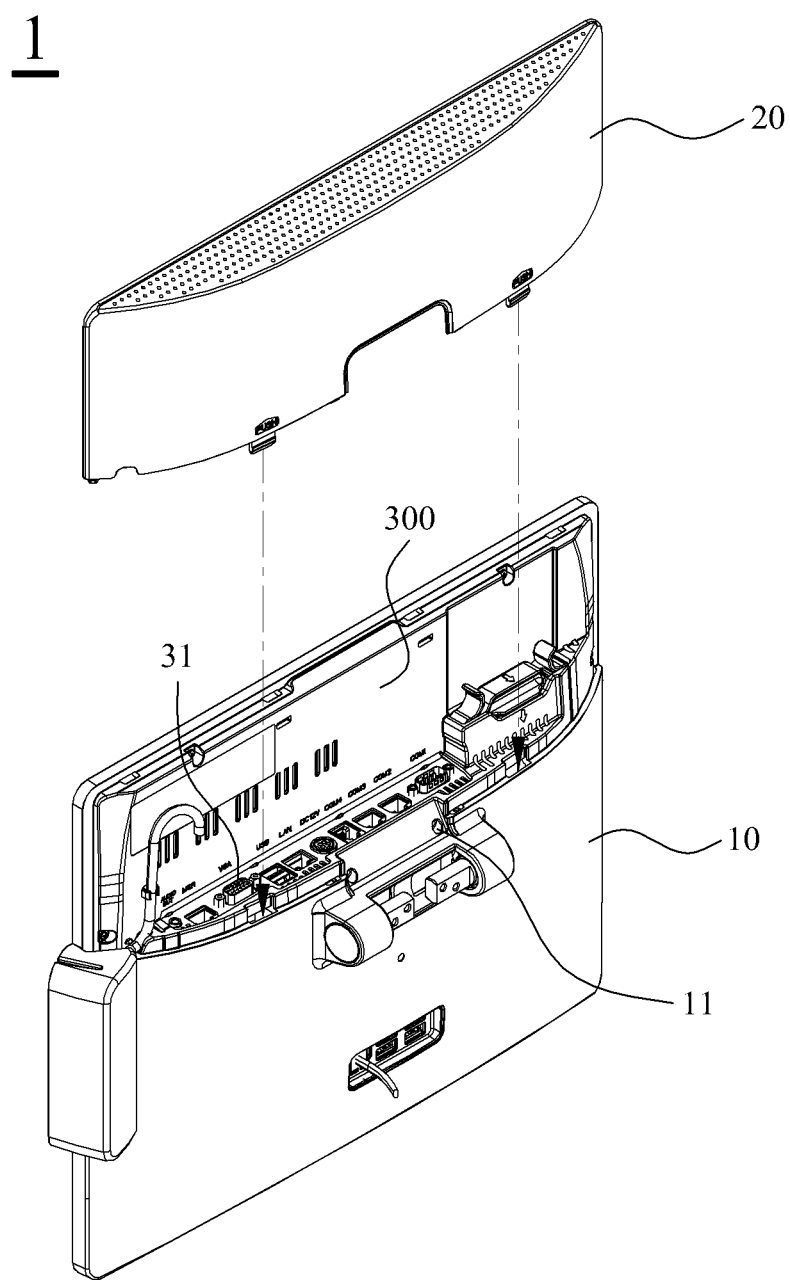
FIG. 1 is a view illustrating a rear surface structure of an input/output port mounting unit integrated type display frame for POS equipment according to an embodiment of the present invention.

Hereinafter, an input/output port (hereinafter, referred to as an I/O port) mounting unit integrated type display frame for POS equipment according to an embodiment of the present invention will be described in detail with reference to the accompanying drawings. It is also noted that like reference numerals denote like elements in appreciating the drawings. Moreover, detailed descriptions related to well-known functions or configurations will be ruled out in order not to unnecessarily obscure subject matters of the present invention.

As illustrated in FIG. 1, an I/O port mounting unit integrated type display frame 300 for POS equipment is mainly used for the POS equipment including a cover 20 that is coupled to an upper side of a rear surface case 10 in an attachable/detachable manner and exposes the I/O port mounting unit when detached. However, the embodiment of the present invention is not limited thereto. For example, the I/O port mounting unit integrated type display frame 300 for POS equipment may be used for POS equipment including I/O ports having various structures.

Figure 2:
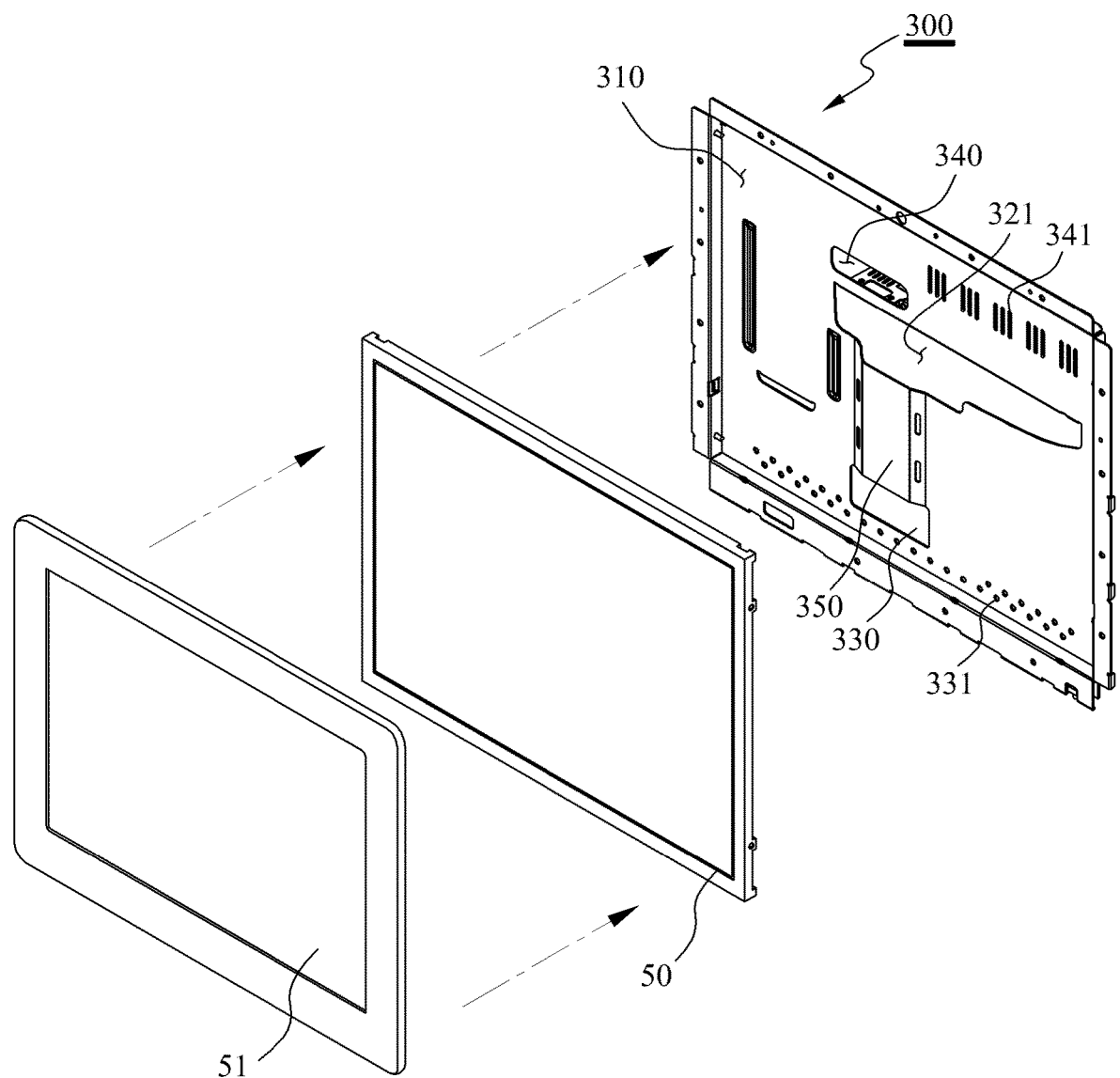
FIG. 2 is an exploded perspective view illustrating a front surface of the input/output port mounting unit integrated type display frame for POS equipment according to an embodiment of the present invention.
Figure 3:
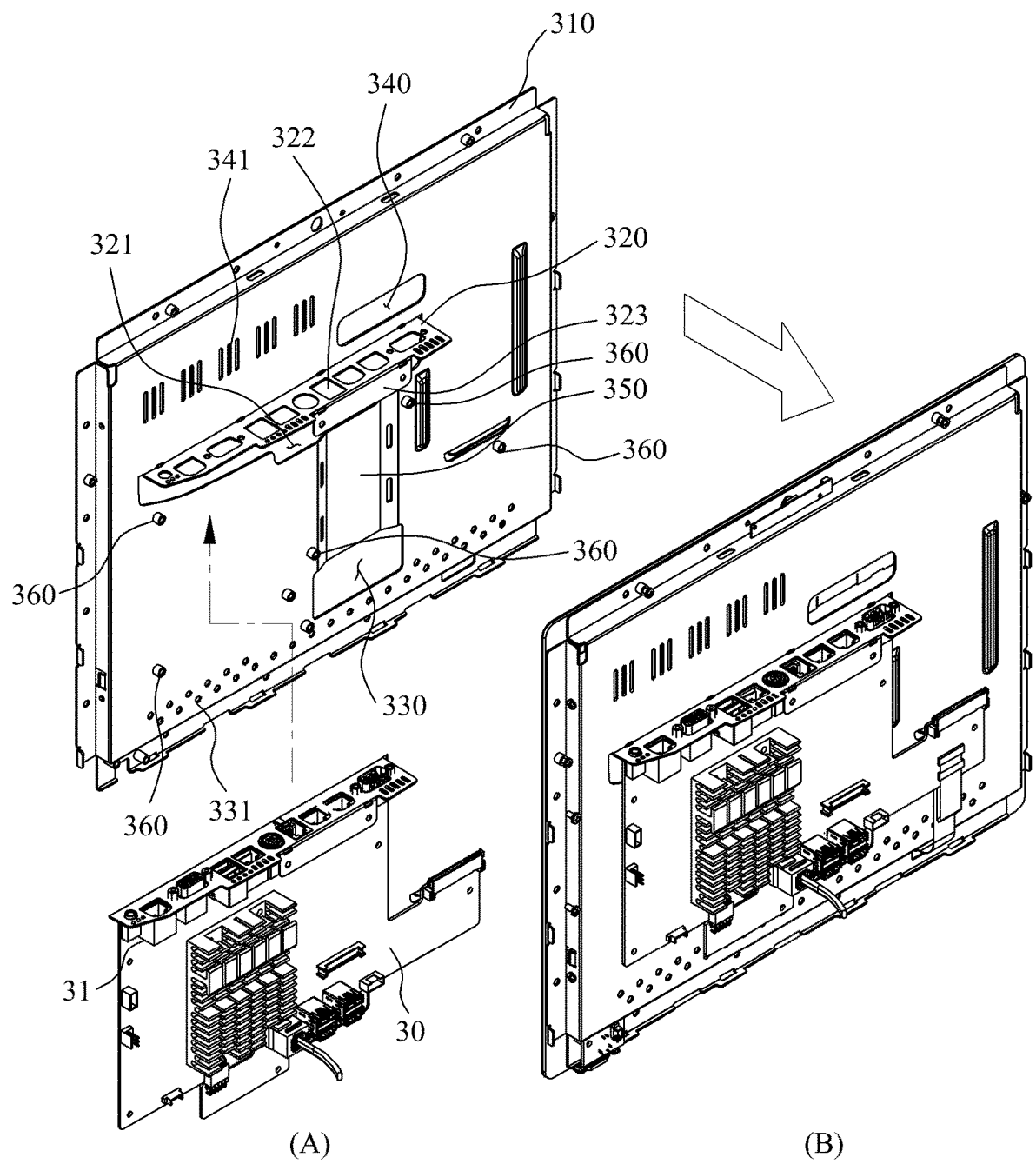
FIG. 3 is an exploded perspective view illustrating a rear surface of the input/output port mounting unit integrated type display frame for POS equipment according to an embodiment of the present invention.

As illustrated in FIGS. 2 and 3, the I/O port mounting unit integrated type display frame 300 for POS equipment includes a display panel mounting unit 310, in which a display panel 50 is inserted and loaded, formed at a front surface thereof. In this case, although the display panel 50 may be mounted through a screw hole defined in a side surface of the I/O port mounting unit integrated type display frame 300 for POS equipment by using a mounting screw, the embodiment of the present invention is not limited to the mounting method. For example, the display panel 50 may be mounted through various embodiments. Also, as illustrated in FIG. 2, a touch panel 51 may be additionally mounted to an outer side of the display panel 50.

Figure 4:
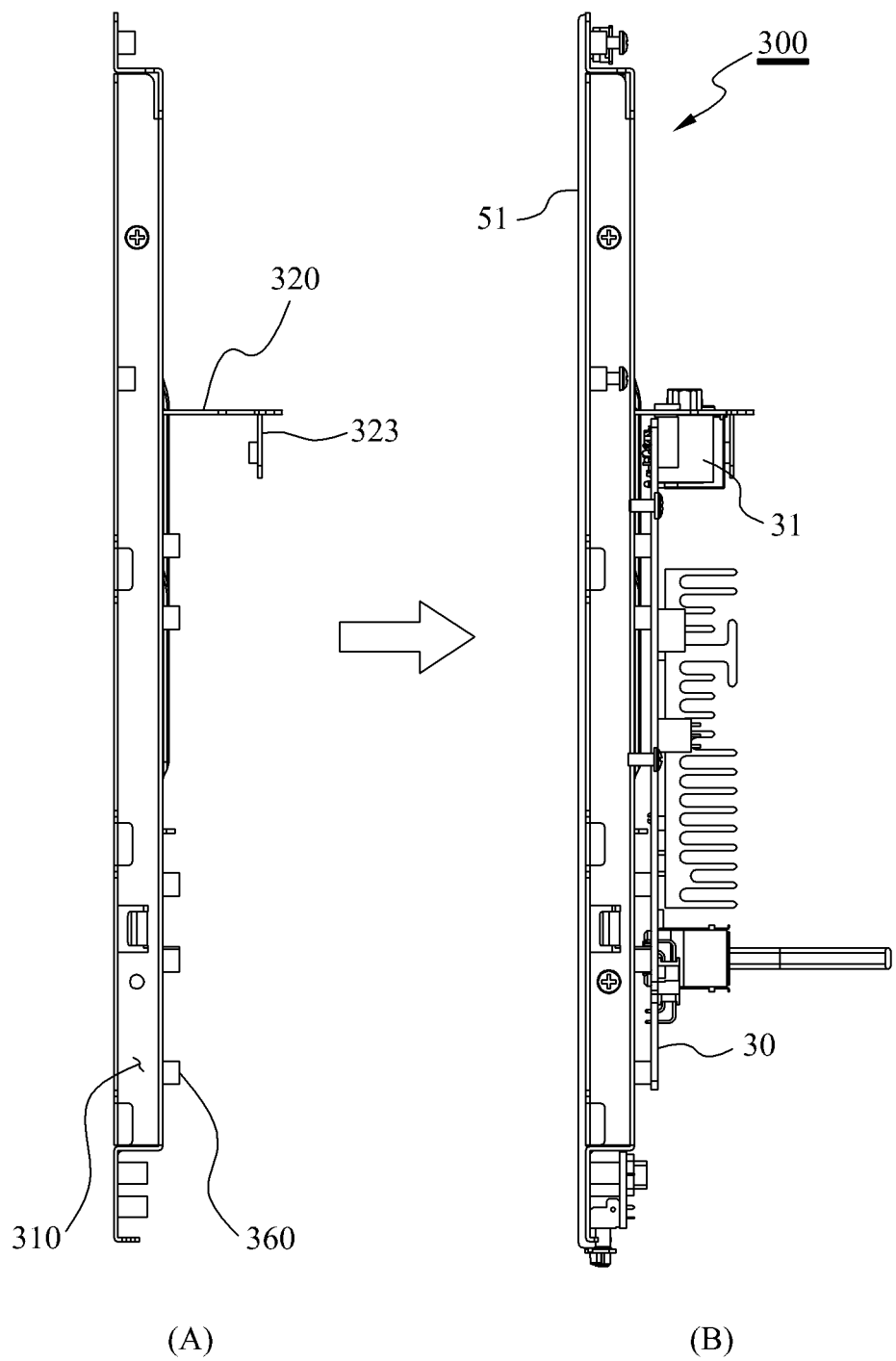
FIG. 4 is a side view illustrating the input/output port mounting unit integrated type display frame for POS equipment according to an embodiment of the present invention.

As illustrated in FIGS. 3 and 4, the I/O port mounting unit integrated type display frame 300 for POS equipment includes the I/O port mounting unit 320 formed at a rear surface thereof and having an I/O port mounting hole 322, in which an I/O port 31 provided at a main substrate 30 is inserted and coupled. The I/O port mounting unit has a part cut from an I/O port mounting unit perforation 321 and is formed to be bent towards the rear direction so as to be protruded therefrom. That is, the I/O port mounting unit 320 is constituted by a portion of the /O port mounting unit integrated type display frame 300 for POS equipment, instead of being separately manufactured and then assembled. Accordingly, through the above-described extremely efficient single structure, the display panel, the main substrate, and the I/O port of the main substrate may be mounted to each other in a mechanically firm manner, and manufacturing costs and efficiency of the manufacturing process may be enhanced.

Also, as the I/O port mounting unit perforation 321 is configured to have a cut part, which serves as a ventilation hole for a part constituting the I/O port mounting part 320, an ascending air current, which is generated due to heat generation of the display panel 50 or the main substrate 30, is smoothly flown and circulated with a lower main ventilation hole 330, which will be described later, efficient heat discharge may be performed even during a long time operation without an additional circulation unit.

As illustrated in FIGS. 3 and 4, the lower main ventilation hole 330 is formed at a lower side of the rear surface of the I/O port mounting unit integrated type display frame 300 for POS equipment.

Also, as a recessed kernel 350, which is recessed inward, is formed between the I/O port mounting unit perforation 321 and the lower main ventilation hole 330, an effective area of a fluid passage, through which a fluid is circulated while discharging heat generated from the main substrate 30, increases, and the air circulation for heat discharge is desirably more smoothly performed.

In this case, for more smooth air circulation, as illustrated in FIGS. 2 and 3, the I/O port mounting unit integrated type display frame 300 for POS equipment according to an embodiment of the present invention further includes: an upper first ventilation hole 340 formed at an upper side of the I/O port mounting unit perforation 321; a plurality of upper second ventilation holes 341 formed at the upper side of the I/O port mounting unit perforation 321; and a plurality of lower auxiliary ventilation holes 331 formed at a lower side of the lower main ventilation hole 330.

Figure 5:
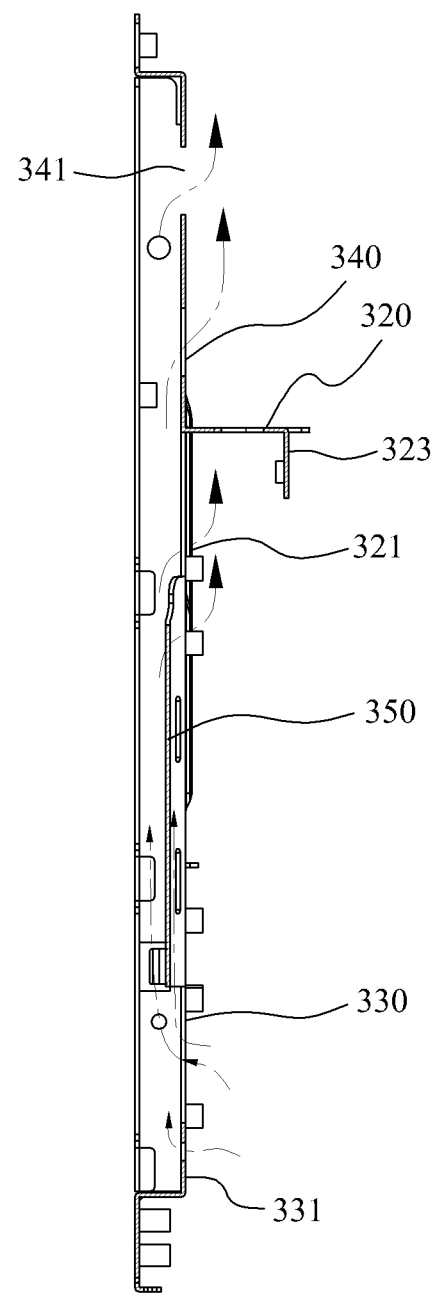
FIG. 5 is a view illustrating an air circulation structure of the input/output port mounting unit integrated type display frame for POS equipment according to an embodiment of the present invention.

Through the above-described structure, the I/O port mounting unit integrated type display frame 300 for POS equipment according to an embodiment of the present invention may allow the ascending air current generated by the heat generation of the display panel 50 or the main substrate 30 to be smoothly circulated as illustrated by an arrow in FIG. 5, to effectively discharge the heat even during a long time operation.

Also, as illustrated in FIGS. 3 and 4, the I/O port mounting unit integrated type display frame 300 for POS equipment desirably further includes a main substrate mounting unit 360, to which the main substrate 30 is mounted and fixed, so as to mechanically couple and fix the main substrate 30.

Also, as described above, when the POS equipment includes the cover 20, which is coupled to the upper side of the rear surface case 10 in an attachable/detachable manner and exposes the I/O port mounting unit 320 when detached, as the input/output port mounting unit 320 is further formed with a rear surface case coupling part 323, which is formed by consecutively bending an end of the input/output port mounting unit 320 so as to be fixed to the rear surface case 10, the I/O port mounting unit integrated type display frame 300 for POS equipment may be coupled to the rear surface case 10 in a mechanically firm manner through a frame coupling through-hole 11 formed at the rear surface case 10 by using a coupling unit such as a bolt or a screw as illustrated in FIGS. 3 and 4.

Hereinabove, the preferred embodiments were disclosed in the drawings and specification. While specific terms were used, they were not used to limit the meaning or the scope of the present invention described in claims, but merely used to explain the present invention. Accordingly, a person having ordinary skill in the art will understand from the above that various modifications and other equivalent embodiments are also possible. Hence, the real protective scope of the present invention shall be determined by the technical scope of the accompanying claims.

The invention claimed is:

1. An input/output port mounting unit integrated type display frame (300) for POS equipment, comprising:
   a display panel mounting unit (310), in which a display panel (50) is loaded, formed at a front surface thereof;
   an input/output port mounting unit (320) formed at a rear surface thereof and having an input/output port mounting hole (322), in which an input/output port (31) provided at a main substrate (30) is inserted and coupled, the input/output port mounting unit having a part cut from an input/output port mounting unit perforation (321) and being formed to be bent towards a rear direction so as to be protruded therefrom; and
   a lower main ventilation hole (330) formed at a lower side of the rear surface thereof.

2. The input/output port mounting unit integrated type display frame (300) for POS equipment of claim 1, further comprising a recessed kernel (350) that is recessed inward and formed between the input/output port mounting unit perforation (321) and the lower main ventilation hole (330).

3. The input/output port mounting unit integrated type display frame (300) for POS equipment of claim 2, further comprising a main substrate mounting unit (360) to which the main substrate (30) is mounted and fixed.

4. The input/output port mounting unit integrated type display frame (300) for POS equipment of claim 3, further comprising:
   an upper first ventilation hole (340) formed at an upper side of the input/output port mounting unit perforation (321);
   an upper second ventilation hole (341) formed at the upper side of the input/output port mounting unit perforation (321); and
   a plurality of lower auxiliary ventilation holes (331) formed at a lower side of the lower main ventilation hole (330).

5. The input/output port mounting unit integrated type display frame (300) for POS equipment of claim 1, wherein the POS equipment (1) comprises a cover (20) that is coupled to an upper side of a rear surface case (10) in an attachable/detachable manner, and exposes the input/output port mounting unit (320) when detached, and
   the input/output port mounting unit (320) is further formed with a rear surface case coupling part (323), which is formed by consecutively bending an end of the input/output port mounting unit (320) so as to be fixed to the rear surface case (10).

\* \* \* \* \*